United States Patent [19]

Pavone et al.

[11] Patent Number: 4,940,641

[45] Date of Patent: Jul. 10, 1990

[54] APERTURE DISC AND METHOD OF MAKING THE SAME

[75] Inventors: Robert J. Pavone, South Windsor; Bruce L. Davidson, East Hartford; Henry F. Berdat, Manchester, all of Conn.

[73] Assignee: The Gerber Scientific Instrument Company, South Windsor, Conn.

[21] Appl. No.: 320,418

[22] Filed: Mar. 8, 1989

Related U.S. Application Data

[62] Division of Ser. No. 157,285, Feb. 17, 1988, Pat. No. 4,841,316.

[51] Int. Cl.$^5$ .............................................. G03F 1/00

[52] U.S. Cl. .......................................... 430/5; 430/22; 354/4

[58] Field of Search ................. 430/4, 5, 22, 320, 321; 354/4, 76, 77

[56] References Cited

U.S. PATENT DOCUMENTS

| | | | |
|---|---|---|---|
| 2,413,600 | 12/1946 | Bierman | 430/321 |
| 3,330,182 | 7/1967 | Gerber et al. | 354/4 |
| 3,538,828 | 11/1970 | Genovese | 430/5 |
| 4,516,842 | 5/1985 | Trombert | 354/4 |
| 4,653,882 | 3/1987 | Cerf | 354/4 |

*Primary Examiner*—Jose Dees

*Attorney, Agent, or Firm*—McCormick, Paulding & Huber

[57] ABSTRACT

An indexing system for selectively orienting one of a series of arcuately oriented different sized and/or shaped apertures formed around an aperture disc used in a photohead for exposing upon a photosensitive surface detailed graphic information using a light beam. The aperture disc has formed thereon, equidistantly spaced indicators in the form of slots allowing radiant energy generated by a light emitter to impede upon and energize a split cell photosensitive detector. A control system rotates an aperture wheel to a next selected position at a first velocity until a selected aperture is within the vicinity of the next selected position and subsequently rotates the aperture disc at a second slower velocity to precisely position the next selected position in registry with the light beam. A method for creating the aperture disc includes inscribing with a light beam upon a film, the pattern of the aperture and the indicators, developing the film as a master and contact printing copies of the images formed on the master.

16 Claims, 5 Drawing Sheets

APERTURE DISC AND METHOD OF MAKING THE SAME

CROSS REFERENCE TO RELATED APPLICATIONS

This is a divisional of co-pending application Ser. No. 157,285 filed on Feb. 17, 1988, now U.S. Pat. No. 4,841,316.

The present application relates to copending application Ser. No. 153,810 filed on Feb. 8, 1988 entitled HIGH RESONANCE DRIVE TABLE AND METHOD OF MAKING A PLANAR WORK SURFACE, U.S. Pat. No. 4,816,847 and application Ser. No. 158,338 filed on Feb. 22, 1988 entitled LAMP DRIVER SCHEME, U.S. Pat. No. 4,849,777.

BACKGROUND OF THE INVENTION

This invention relates to an apparatus for selectively indexing an aperture wheel along circumferentially spaced points and, more particularly, is concerned with an apparatus that precisely orients apertures formed on the wheel in alignment with a beam of light or similar radiant energy to selectively generate, by photoexposure, different images on a photosensitive surface.

In forming graphic information on a photosensitive surface, line thicknesses inscribed on the surface may be varied according to the pattern of information by selectively positioning different sized apertures in registry with the light beam to generate a single point or spot of light on the photosensitive surface. A line is generated on the photosensitive surface by the relative movement of the light spot and the photosensitive surface. In forming varied detailed graphic information, such as a mask having precise circuitry formed thereon, a photohead must effect successive selections of different sized and/or shaped aperatures rapidly and precisely. Since movement of the photohead relative to the photosensitive surface cannot occur until selection of the proper aperature is complete, a substantial savings in time is realized when the selected aperatures are indexed rapidly.

In U.S. Pat. No. 3,330,182 issued July 11, 1967 an aperature wheel is utilized to selectively position different sized and/or shaped aperatures in registry with a light beam exposing images on a photosensitive surface. A mechanical paw pivots into and out of engagement with circumferentially oriented pins to positively lock the wheel at a selected angular orientation. The accuracy achieved in selectively orienting individual apertures is dependent upon the tolerances maintained between the engaging surfaces of the paw and the pin. Upon continued use, it is conceivable that this accuracy could be diminished with the inherent wear that would accompany the extended use. Moreover, the aperture wheel in this patent cannot rotate to the next desired orientation until the paw pivots out of engagement with the respective pin member. Likewise, the projecting device cannot begin its trace until the paw pivots back into engagement with the newly aligned pin. Thus, the time used in pivoting the paw into and out of engagement with the respective pins can become significant when consecutive indexing is utilized in the formation of complex graphic information.

It is usually desirable to move a photohead at a maximum speed on a coordinate drive system to quickly expose graphic information on the photosensitive surface. The photohead mass should therefore be minimized to reduce the inertial force developed when the photohead is rapidly moved and then stopped by the coordinate drive. Thus, mechanical indexing devices increase the photohead mass and undesirably limit the maximum controllable speed of the coordinate drive since the increased mass generates an additional inertial force that need be compensated by a reduction in the maximum speed.

Accordingly, a general object of the present invention is to provide an improved indexing means for selectively orienting an aperture wheel in a photohead. With more particularity, an object of the present invention is to provide an indexing system for a photohead utilizing an electronic sensor and control means to accurately and swiftly index an aperture wheel located within a photohead at selectively oriented positions.

It is a further object of the present invention to provide a lightweight photohead utilizing an electronic sensor and control means to index a low mass aperture wheel and to therefore eliminate additional mass generated by the use of mechanical indexing elements.

Yet another object of the present invention is to provide a device of the general character mentioned above in which the aperture wheel is quickly rotated to a selected orientation by rotating the wheel in the more favorable of its two rotational directions.

A still further object of the present invention is to provide a photohead utilizing an indexing system having a control means for rotating the aperture wheel at a first velocity until the selected aperture is moved within the vicinity of the light beam and then rotating the aperture wheel at a second slower velocity until the selected aperture is in precise registry with the light beam.

Another object of the present invention is to provide a low cost, lightweight aperture disc having indicators formed integrally with the disc and oriented in association with corresponding apertures.

SUMMARY OF THE INVENTION

The present invention resides in an indexing aperture system having an electronic control and sensor means for selectively positioning an aperture means relative to a light beam. The apparatus comprises a frame defining a beam axis, a radiant energy emitting source located at one end of the beam axis and a beam imaging means placed coincident with the beam axis for forming a light beam from the radiant energy source. The aperture means are rotatably supported by the frame in a plane orthogonal to the beam axis. Formed on the aperture means are light openings defining two radially spaced apart arcuate paths. The first path is comprised of different sized and or shaped apertures and the second path is comprised of a plurality of indicators. The aperture means is rotatably supported to position the first path in registry with the beam axis formed by the beam imaging means. Drive means are supported by the frame and engage with the aperture means to selectively rotate the aperture means to position a selected one of the different sized apertures in alignment with the beam axis. An initializing means for referencing a given indicator as an initial point is also provided. The movement of the indicators is sensed by a sensor fixed to the frame and located in alignment with the second arcuate path to generate a signal corresponding to the movement of an indicator across the sensor. Control means are connected with the sensor and the drive means to receive the signals generated by the sensor and to establish from the signals the position of the aperture means relative to the given initialized indicator and to instruct the drive means to rotate the aperture means to selectively position another of the different sized apertures in precise alignment with the beam axis.

The aperture means of the present invention employs an aperture disc formed from a thin flat sheet of material and is made by a method utilizing thin film exposure techniques. Initially, the different sized apertures and the indicators are drawn on a photosensitive film by a light beam and the film is subsequentially developed forming a master and subsequently is used to contact print copies of the aperture disc.

DESCRIPTION OF THE PREFERRED EMBODIMENTS

Figure 1:
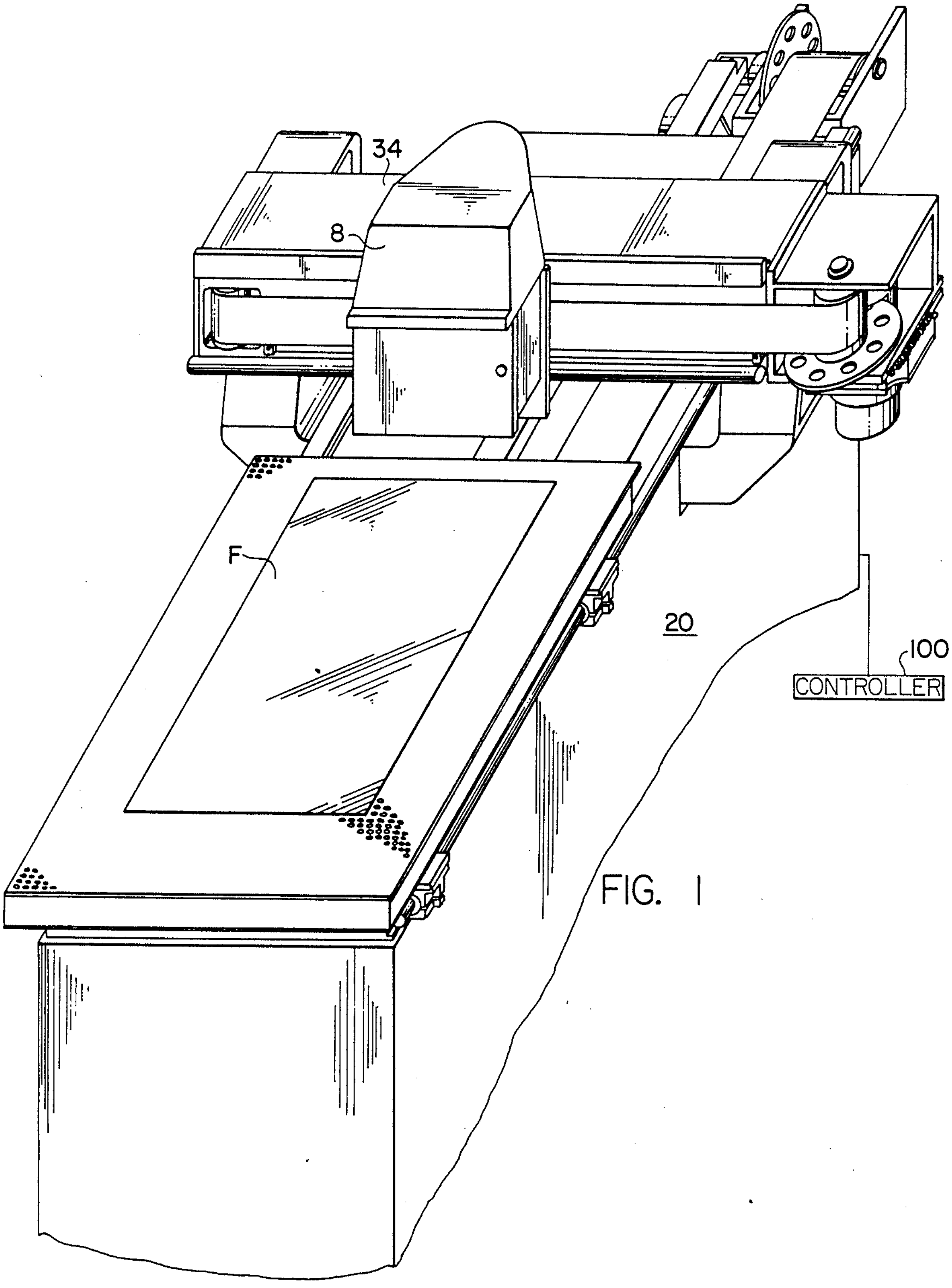
FIG. 1 is a perspective view of a coordinate control system employing the photohead of the present invention.

FIG. 1 shows a photohead of the present invention employed in a coordinate control drive system. The photohead 8 is supported by the base 20 and moves back and forth along a first coordinate direction on a tool carriage slidably supported by the bridge 34. The photosensitive work piece F is supported on a movable work table sliding back and forth in a second coordinate direction orthogonal with the first coordinate direction. A light beam is emitted by the photohead 8 to selectively expose a pattern on the work piece F. Precise relative movements between the photohead and the work table expose upon the photosensitive surface F precise graphic information used for example in the formation of miniaturized circuit patterns.

Figure 2:
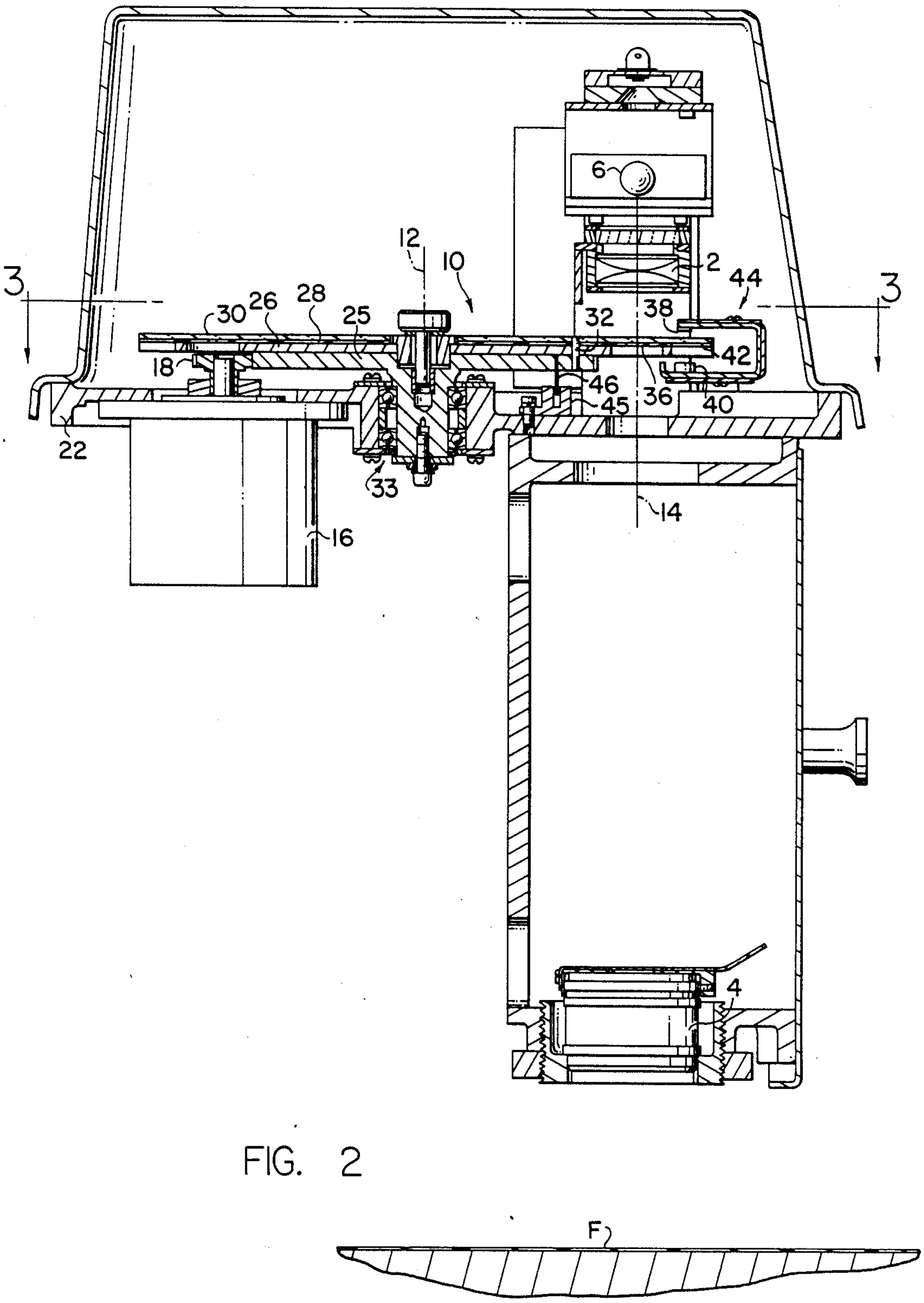
FIG. 2 is a sectional view of the photohead taken along line 2—2 in FIG. 3.

A beam imaging means, as shown in FIG. 2, generates a highly focused point of light on the photosensitive work piece F. An incandescent lamp 6 partially covered by a reflector reflecting otherwise diverging light toward the workpiece F, provides a radiant energy emitting means. Radiant energy is focused into a first beam by a condensor lens 2 and into a second reduced beam by the objective lens 4. For a more complete description of the behavior of the condensor lens 2 and the objective lens 4 reference may be had to U.S. Pat. No. 3,330,182. It should be appreciated, however, that the lamp 6 and the lenses 2 and 4 are aligned in a vertically extending beam axis 14 intersected by aperture means generally designated as 10. The beam axis 14 is generally parallel to an aperture means axis of rotation 12. The aperture means or wheel 10 is an assembly of elements rotatably supported on a frame 22 and presents a generally opaque surface to the lamp 6. Various sized apertures 36 are spaced apart from one another and are oriented concentrically with the central axis of rotational 12 and are in alignment with the beam axis 14. Each of the apertures 36, when rotated into registry with the beam axis 14, selectively permits different amounts of light to pass through the wheel 10. Since the apertures 36 have diameters that vary in size along an arcuate path, selective rotational positioning of the wheel 10 relative to the beam axis 14 varies the size and/or shape of the light spot focused on the photosensitive work sheet F.

Thus, in accordance with the invention, the apertures 36 are selectively rotated into precise alignment with the beam axis 14 by electronic control means. A drive step motor 16 is supported by the frame 22 and has a pinion 18 engagable with a drive circular gear 25 to rotate the wheel 10 in either a clockwise or a counter clockwise direction. The wheel 10 includes a lightweight support plate 26 fixed to the drive gear 25 and an aperture disc 28 supported by the support plate 26. The aperture disc 28 is a generally opaque element and has formed thereon the different sized apertures that allow light to selectively pass through the opaque surface of the aperture disc 28. A transparent cover plate 30 overlays and helps to maintain the aperture disc 28 in engagement with the support plate 26. A vertically depending pin 32 is fixed within the support plate 26 and is received within corresponding openings in the aperture disc 28 and the cover plate 30 to insure the positive transfer of rotation from the support plate 26 to the aperture disc 28. It should be understood that the support plate 26 is perforated forming general openings around two circular paths allowing passage of light through the plate 26 at points in registry with the aperture disc openings. These perforations are oversized and so do not interfere with the light beam defined by an aperture on the disc 28. Also, journal bearings 33 provide means supporting the wheel 10 for rotation relative to the frame 22 about the axis of rotation 12 and positions the aperture wheel assembly 10 at a fixed radial distance from the beam axis 14. In operation, the motor 16 drives the wheel 10 in either a clockwise or a counter clockwise direction to position a selected one of the apertures 36 in registry with the beam axis 14.

Figure 3:
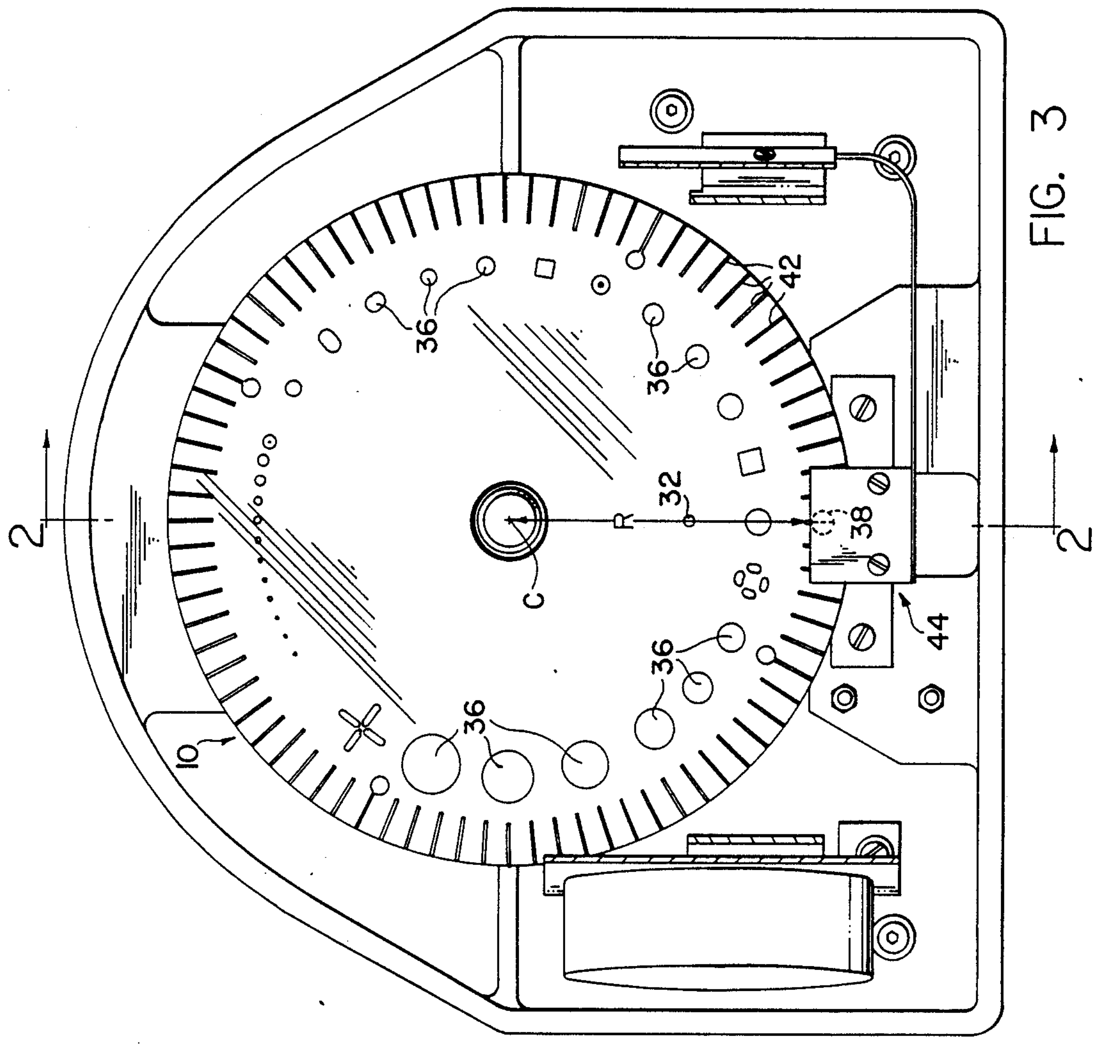
FIG. 3 is a top view of the photohead taken along line 3—3 of FIG. 2.

As previously discussed, the aperture disc 28 is a thin, generally opaque sheet of material having a pattern of apertures 36 formed along in a first arcuate path concentric with the central axis 12. To indicate the presence of the apertures 36 along the disc 28, indicators 42 are equidistantly spaced along a second arcuate path on the disc 28 concentric with the first arcuate path of the apertures 36. Furthermore, as shown in FIG. 3, each of the apertures 36 and a corresponding indicator 42 are in precise radial alignment with the wheel center C. Like the apertures 36, the indicators 42 are optical openings permitting radiant energy to selectively pass through the opaque surface of the aperture disc 28. The indicators 42 are precisely formed slots having a uniform width extending radially inward from the outer circumferential perimeter of the disc 28 and indicate the angular spacing between the apertures 36. General openings forming slots are cut out of the support plate 26 at points in registry with the indicators 42 to allow passage of light through the support plate 26 as has been previously discussed. These general openings are slightly oversized relative to each indicator width and so do not interfere with the passage of radiant energy defined by the indicators 42.

The second arcuate path defined by the indicators 42 is positioned in registry with an electronic sensor 44 comprising a light emitter 40 and a detector 38. Both the detector 38 and the light emitter 40 are fixed to the frame 22 in a spaced relationship with one another. As shown in FIG. 2, the outer depending portion of the disc 28 defining the pattern of indicators 42 is received within the space defined by the detector 38 and the light emitter 40. As the disc 28 rotates past the sensor 44, radiant energy emitted by the emitter 40 impinges upon the indicators 42 to allow a beam of light defined by an indicator width to strike the detector 38 and subsequently indicate the presence of an aperture at that angular orientation. Accordingly, the aperture wheel 10 and the sensor 44 obviates the need to use a mechanical indexing device and result in rapid and more accurate positioning of selected apertures in registry with the beam axis 14.

The present invention is also concerned with a control means for selectively rotating different ones of the apertures 36 in registry with the beam axis 14. An important characteristic of the control means of the present invention is the split feature of the detector 38. As can be seen in FIG. 3 the detector 38 is comprised of a split cell having two photosensitive diodes having identical arcuate profiles ending in straight opposing faces. These straight opposing faces are symmetrically oriented along a radius R relative to the center C. As the light generated by the emitter 40 passes through a moving indicator 42 and impinges on one half of the split cell before the other half, a difference in voltage between the cells is generated. Furthermore, when an indicator 42 is symmetrically aligned along the given radius R, the voltage in each of the photosensitive diodes is balanced. As each passing indicator 42 rotates across the two photosensitive diodes, the point where the two photosensitive diodes have a balance voltage indicates to the control means that an indicator is in precise radial symmetry with the radius R. A switch 45, shown in FIG. 2, is connected with the control means and is fixed to the frame 22 for engagement by a pin 46 oriented on the gear 25 in radial alignment with one of the indicators 42 serving as a reference indicator. The switch 45, when activated by the pin 46, indicates to the control means the presence of the reference indicator at the reference point defined by the position of the switch 45 on the frame 22. The control means begins the indexing process by rotating the wheel 10 to initialize the reference indicator with the switch 45. Thus, by counting the number of balance points generated by the sensor 44 as the wheel 10 rotates in either direction past the sensor 44, the control means calculates the angular displacement of the wheel relative to the initialized reference point and selectively orients one of the different sized apertures 36 in registry with the beam axis 14. It should be noted that the light emitter 40 is an infrared light source, the detector 38 is an infrared light sensitive detector and the switch 45 can be any type of motion sensitive device.

Figure 5:
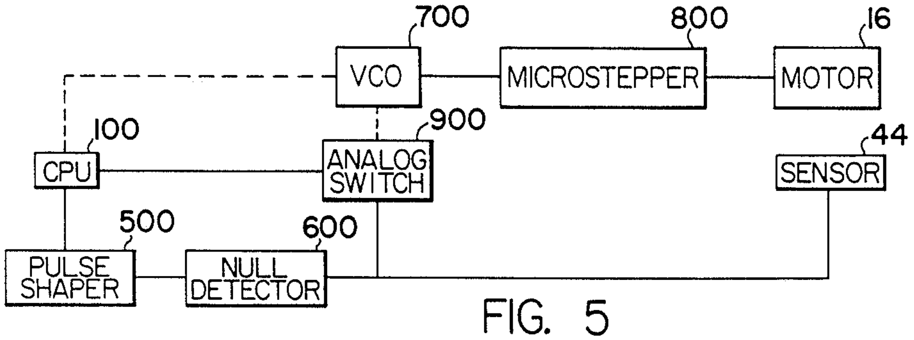
FIG. 5 is a block diagram illustrating the control means utilized in the present invention for accomplishing a duel velocity indexing of the aperture means.

FIG. 5 is a block diagram of the control means utilized by the present invention to position the wheel 10 relative to the frame 22 accurately and precisely by rotating the aperture assembly at two rotational velocities. As previously discussed, the split cell detector 38 generates a balanced voltage when an indicator is in precise radial alignment with the radius R. The voltages generated in each split cell of detector 38 are inputted into a null detector 600. The null detector 600 in turn identifies a balance voltage as a signal representing a null point balanced voltage. Also, entered as input into a controller or CPU 100 are position values corresponding to the arcuate placement of the indicators 42 along the disc 28 relative to the given reference indicator. Further data entered in the CPU 100 instruct the CPU to position successively different ones of the apertures 36 in registry with the beam axis 14. The null detector, once identifying a null point, generates a signal received by the pulse shaper 500. In turn, the pulse shaper 500 generates a pulse inputted into the CPU 100 corresponding to the presence of a null. The CPU 100 summates the pulses as the indicators rotate past the sensor 44 and compares the summation with the inputted data identifying the position value of the indicator corresponding to the desired next one of the apertures 36. A detailed description of the particular elements enabling the summation and comparison of signals occurs in the discussion of FIG. 6. When the difference or imbalance between summated pulses and the next desired position value indicates that the wheel 10 is positioned two or more indicators away from the indicator corresponding to the next desired position, the CPU 100 generates a voltage signal commanding the voltage control oscillator 700 and in turn the microstepper 800 to rotate the step motor 16 at a first rapid velocity. However, when the CPU 100 determines the imbalance between the summated pulses and the next desired position value to indicate the wheel 10 is positioned within one indicator of the indicator corresponding to the next desired position, control of the step motor 16 is transferred from the CPU 100 to the analog switch 900. The voltage control oscillator 700 now receives as input, a second voltage signal generated by the analog switch 900 to precisely align the selected indicator at a second slower velocity with the given radius R. The second slower velocity generated by the analog switch 200 is proportional to the amount of light activating the split cell detector 38. Once however, a voltage balance is achieved in the detector, the second slower velocity signal ceases, the drive motor 16 stops and the selected one of the indicators 42 is positioned in precise symmetrical alignment with each half of the split cell detector placing a selected one of the apertures 36 in precise registry with the beam axis 14. Thus, the control system of the present invention provides a first positioning velocity and a second slower positioning velocity to rapidly index at the first velocity a selected indicator within one indicator of the sensor and subsequently, precisely move the selected indicator into registry with the split cell detector 38 at the second slower velocity.

Figure 6:
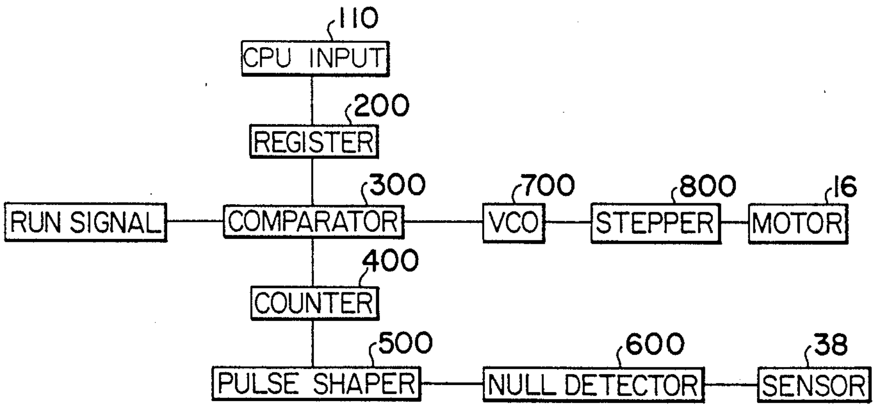
FIG. 6 is a block diagram of the control means utilized in the present invention illustrating in greater detail the CPU logic used in cooperation with the control means.

In accordance with a further aspect of the invention, the control system rotates the wheel 10 from a present position to the next desired position through the shortest path. It should be appreciated that when selected ones of the apertures 36 are rapidly indexed, significant savings in time is achieved in the formation of graphic information utilizing different aperture sizes and shapes. FIG. 6 illustrates a block diagram of the CPU logic utilized in the present invention directionally controlling the rotational direction of the aperture wheel 10. As previously mentioned, the motor 16 drives the wheel 10 in either a clockwise or a counterclockwise direction. The CPU logic relates increasing values corresponding to the increased arcuate distance of each indicator from the reference indicator. Data entered as input 110 relates particular aperture types to values corresponding to an aligned indicator. A next desired position to be indexed, referencing an indicator value, is also entered as input and is temporarily stored in a register 200 of the CPU 100 and is translated into a signal inputted into a comparator 300 when a next selected aperture size is to be indexed. The CPU 100 utilizes a counter 400 to summate the previously discussed pulses generated by the movement of the indicators past the sensor 44. In counting these pulses relative to the reference indicator, the counter 400 maintains a summated value representing the angular position of the aperture disk 28 relative to the fixed reference point defined by the switch 45. A signal corresponding to the the present position of the wheel 10 is inputted from the counter 400 into the comparator 300. When it is desired to index another one of the apertures 36 in registry with the beam axis 14, the CPU logic shown in FIG. 6 determines the rotational direction achieving the shortest route to the next position by comparing the summated present position value with the next desired position value. The CPU 100 utilizes the comparator 300 to compare the two values and to recognize a difference in amounts as an inequality. The comparator evaluates the inequality relative to the amount of the present position value and generates a first directional signal where the difference between the values is less than zero or, conversely, generates a second directional signal where the difference between the amounts is greater than zero. Each directional signal corresponds consistently with one of the two rotational directions of the wheel 10. The appropriate directional signal is inputted into the voltage control oscillator 700 to drive the motor 16 and to subsequently rotate the wheel 10 the amount of the difference between values in either a clockwise or a counterclockwise direction to position a next selected one of the apertures 36 into registry with the beam axis 14 by the shortest path possible. Where no imbalance between compared values exists, indicating that the selected aperture is already in registry with beam axis 14, the motor 16 need not be energized. Subsequently, the comparator 300 generates a run signal to the CPU logic controlling the tracing movements of the photohead relative to the workpiece F.

Also in accordance with the invention, the aperture disc 28 utilized in the photohead 8 is comprised of a flat, thin, transparent sheet of material having an opaque surface formed thereon. The aperture disc 28 has a preferable thickness of approximately 1.0 millimeter. Both paths of marks defining the apertures 36 and the indicators 42 are the transparent portions of the disc 28 forming through contrast with removed portions of the opaque surface of the disc 28, light openings therein. These light openings are formed on the disc 28 by a thin film exposure method. In creating the aperture disc 28, the apertures 36 and the indicators 42 are exposed by light spots using a precision light source on a sheet of unexposed photographic film. A photoplotter such as the one employed with the present invention is one such precision light source that may be used to expose upon the film the precise orientations and shapes of the apertures and indicators. Once the spots have been exposed on the film, the film is then developed and a positive image defining marks is made from the spots exposed on the film. The positive is then utilized in a master transparency to contact print copies of the pattern of marks onto a substrate material. The substrate material is a transparent sheet preferably formed from clear plastic or the like, that constitutes the disc shape. A thin photosensitive layer of opaque emulsion applied over one of the surfaces on the substrate to contact print the outline of the pattern of marks from the master. The pattern of marks developed on the master is transferred onto the emulsion surface formed on the substrate by exposing portions of the photosensitive emulsion to light passing through the master. In contact printing copies of the disc, the master is placed in contact with the emulsion surface so that no distortion of the radiant energy passing through the master occurs. Subsequently, the exposed areas of the photosensitive emulsion surface define a precision image accurately outlining the paths of marks defined by the master when developed by commonly known photolithographic techniques.

The emulsion film can be selected from any number of photosensitive compounds whose solubility changes when exposed to radiant energy, preferably ultraviolet light. Also, an emulsion photoresist is selected such that removal of either the exposed or unexposed regions of the emulsion when an appropriate solvent is applied can be effected. Thus, the paths of marks defined on the master need not necessarily be defined by a positive image but could, conversely, be defined by a negative image with a corresponding emulsion photoresist selected to generate the desired outline of the aperture disc 28.

Figure 4:
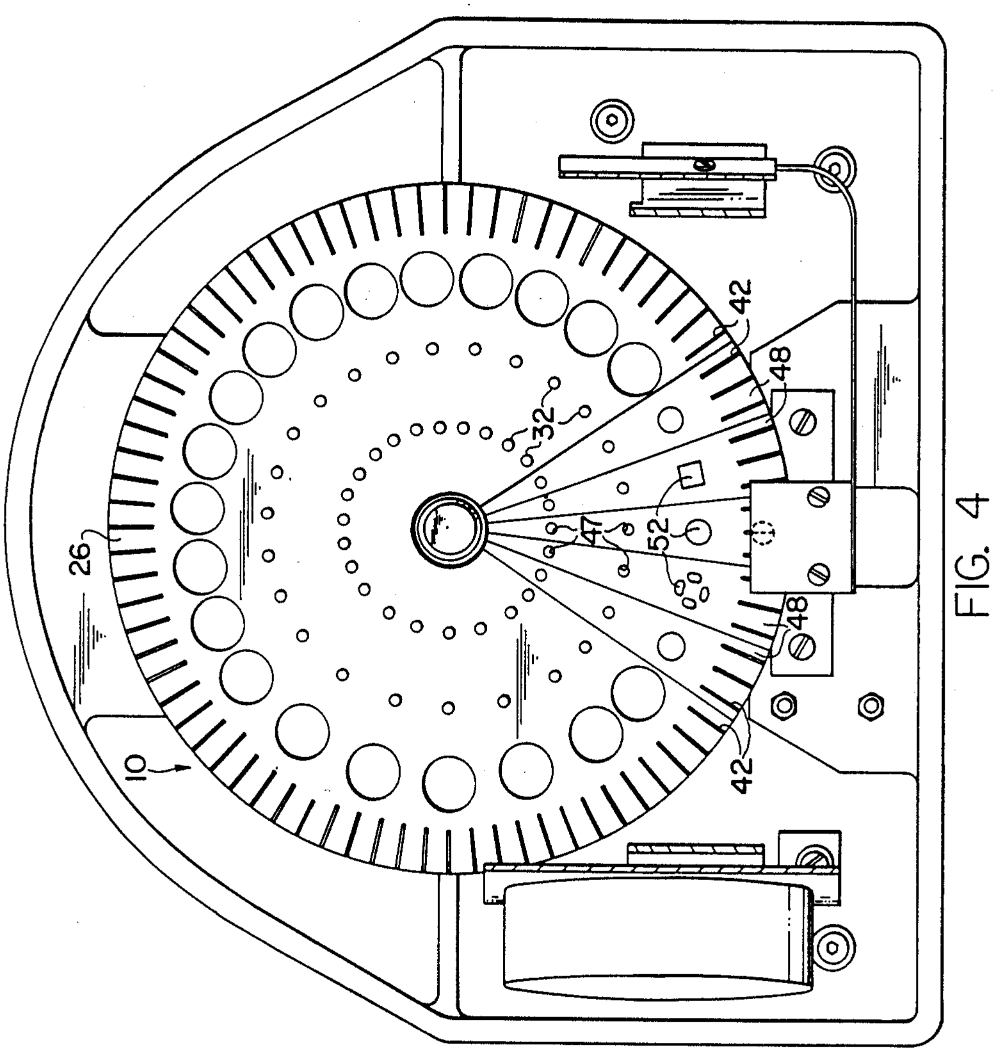
FIG. 4 is taken along line 3—3 of FIG. 2 but shows the alternate embodiment of the aperture means utilized by the invention.

It is a feature of the present invention to provide the aperture wheel 10 with easily removable aperture sectors that can individually be customized to the needs of the user. FIG. 4 illustrates a second embodiment of the aperture wheel assembly 10 employing the aperture sectors 48 attached to the modified support plate 26. The radially aligned array of pins 32 are fixed to the plate 26 and gear 25 and secure the sectors 48 to the plate 26. It should be noted that one of the sectors which define the arcuate pattern of marks is placed in radial registry with the pin 46 to provide an initializing point to the CPU. Each pair of pins 32 secures and positions an aperture 52 formed on the removable pie-shaped sector 48 in registry with the beam axis 14 through a pair of locating holes 46 formed in each sector 48 cooperating with the pins 32. The marks defining the indicator 42 and the aperture 52 on the sector 48 can be formed by contact printing these marks on a pie-shaped piece of substrate material in the same manner as described in the method above. It should be appreciated, however, that when forming the sector 48, only a small strip of unexposed film is utilized at a time to create the aperture sector 48. Thus, in instances where the user requires only a small number of different sized or shaped apertures, or where the user adds different aperture sizes to a design on an as needed basis, use of the aperture sectors is desirable. Furthermore, a savings in unused portions of the disc 28 is affected when only a small fraction of the disc material is needed.

While the present invention has been described in a preferred embodiment it should be understood that various modifications and substitutions to the structures and processes disclosed may be employed. For example, the support plate 26 is a lightweight member formed from aluminum alloy but could be made from any like substance possessing similar strength and weight. Accordingly, the present invention has been described in a preferred embodiment by way of illustration rather than limitation.

We claim:

1. An aperture disc for use in a photohead having a light source exposing upon a photosensitive surface various images and having a light sensor indicating the position of said disc relative to said photohead, wherein said aperture disc comprises:

a thin flat sheet of transparent material having a generally opaque surface adjointed thereto and defining the aperture disc shape;

first marks formed on said aperture disc oriented in a first arcuate path around a center, each of said first marks of said first path selectively allowing radiant energy generated by a light source to pass through the otherwise opaque surface of said aperture disc onto a photosensitive surface;

second marks formed on said aperture disc oriented in a second arcuate path concentric with said first pattern, each of said second marks of said second pattern allowing radiant energy emitted by a light sensor to pass through the otherwise opaque surface of said aperture disc onto a detector formed with the light sensor;

each of the first marks of the first path being in radial alignment with a second mark of the second path whereby said sensor identifies the presence of one of said first marks defining said first path when the corresponding radially aligned second mark defining said second path passes across said light sensor and allows radiant energy to activate said detector.

2. An aperture disc as defined in claim 1 wherein said opaque surface is a thin opaque film formed on a surface of said thin flat sheet, said thin flat sheet being formed from a transparent material such that said first marks defining said first path are removed portions of said thin opaque film exposing transparent portions of said thin flat sheet, and wherein each of the first marks defining the first path are different in size and/or shape with one another.

3. An aperture disc as defined in claim 2 wherein said second marks defining said second path are removed portions of said thin opaque film exposing transparent portions of said thin flat sheet, and the second marks defining the second path are circumferentially oriented slots having uniform widths.

4. An aperture disc as defined in claim 3 wherein the thickness of said aperture disc is approximately equal to 1.0 millimeter.

5. A method of making the aperture disc defined in claim 1 comprising the steps:

providing a sheet of unexposed film;

utilizing a precision light source to expose light spots on said film, the position and orientation of each of said light spots respectively corresponding to the position and orientation of each of said first and second marks;

developing said film to generate an image outlining the portions of said film exposed to said light spots;

utilizing said image as a master;

providing a transparent substrate material to constitute said thin flat sheet of transparent material;

creating said generally opaque surface by applying to a surface of said substrate a thin film of opaque, photosensitive emulsion;

passing a light through areas on said master outlining the portions of said film which were exposed to said light spots and onto corresponding areas of said photosensitive emulsion;

developing said emulsion formed on said substrate surface to precisely remove areas of said emulsion to expose said underlying transparent substrate material at points corresponding to the placement of said first and second marks arranged respectively in said first and second patterns about said aperture disc.

6. A method of making an aperture disc as defined in claim 5 further comprising the step of placing said master in contact with the exposed surface of said thin film of emulsion and subsequently passing said light through said areas on said master to expose said light onto said thin film of emulsion.

7. A method of making an aperture disc as defined in claim 6 further comprising the steps of developing said film to generate a positive image representing said first and second patterns of said first and second marks and utilizing said positive image as a master to contact print on sheets of said transparent substrate material opaque outlines of said first and second patterns of marks.

8. A method of making an aperture disc as defined in claim 6 further comprising the step of exposing said light spots in circular patterns on said film to form a first circular path corresponding to the placement of said first marks and a second circular path corresponding to the placement of said second marks, and said second circular path being oriented concentrically with the first circular path on said master.

9. A method of making an aperture disc as defined in claim 8 wherein the step of exposing said patterns of circularly oriented light spots on said film further includes exposing said light spots on said film such that each of said first marks of said first circular path is in radial alignment with a one of said second marks of said second circular path on said master.

10. A method of making an aperture disc as defined in claim 9 wherein the step of exposing said pattern of circularly oriented spots on said film further includes the step of exposing said spots such that different sized and/or shaped marks are formed along said first circular path on said master and slot-shaped marks are formed along said second path on said master.

11. A method of making an aperture disc comprising the steps:

providing a sheet of unexposed photographic film;

utilizing a precision light source to expose spaced apart light spots on said photographic film;

developing said film to generate an image outlining said photographic light spots as marks on said photographic film;

utilizing said image as a master;

providing a transparent substrate material to constitute the general aperture disc shape;

applying to a surface of said substrate material a thin film of opaque photosensitive emulsion;

passing light through areas on said master outlining said marks and onto corresponding areas of said thin film of opaque photosensitive emulsion; and developing said emulsion formed on said substrate surface to precisely remove areas of said emulsion film to expose said transparent substrate material at points corresponding to the placement of marks on said master.

12. A method of making an aperture disc as defined in claim 11 further comprising the step of placing said master in contact with a surface of said emulsion film and passing said light through said areas on said master outlining said marks to expose said light onto said emulsion film without distortion.

13. A method of making an aperture disc as defined in claim 11 further comprising the steps, developing said photographic film to generate a positive image of said pattern of marks and utilizing said positive image as a master to contact print on said transparent substrate material opaque outlines of said pattern of marks.

14. A method of making an aperture disc as defined in claim 11 further comprising the step of exposing said spots in two circular patterns on said photographic film to form a first circular path of marks and a second circular path of marks oriented concentrically with the first circular path and radially outwardly thereof on said master.

15. A method of making an aperture disc as defined in claim 14 wherein the step of exposing said pattern of circularly oriented spots on said photographic film further includes exposing said spots such that each of said marks of said first circular path is in radial alignment with a mark of said second circular path on said master.

16. A method of making an aperture disc as defined in claim 15 wherein the step of exposing said pattern of circularly oriented spots on said photographic film further includes the step of exposing said spots such that different sized and/or shaped marks are formed along said first circular path on said master and slot-shaped marks are formed along said second path on said master.

* * * * *